US012684213B2

(12) United States Patent
Fan et al.

(10) Patent No.: US 12,684,213 B2
(45) Date of Patent: Jul. 14, 2026

(54) OPTICAL ELEMENT DRIVING MECHANISM

(71) Applicant: Actutek Corporation, Taoyuan City (TW)

(72) Inventors: Chen-Hsien Fan, Taoyuan City (TW); Sin-Jhong Song, Taoyuan City (TW)

(73) Assignee: Actutek Corporation, Taoyuan City (TW)

( * ) Notice: Subject to any disclaimer, the term of this patent is extended or adjusted under 35 U.S.C. 154(b) by 857 days.

(21) Appl. No.: 17/836,331

(22) Filed: Jun. 9, 2022

(65) Prior Publication Data

US 2022/0397741 A1     Dec. 15, 2022

Related U.S. Application Data

(60) Provisional application No. 63/209,750, filed on Jun. 11, 2021.

(51) Int. Cl.
| | |
|---|---|
| *H04N 23/54* | (2023.01) |
| *G01D 5/20* | (2006.01) |
| *G02B 7/02* | (2021.01) |
| *G02B 7/04* | (2021.01) |
| *G02B 7/18* | (2021.01) |

(Continued)

(52) U.S. Cl.
CPC ........... *H04N 23/54* (2023.01); *G01D 5/2046* (2013.01); *G02B 7/022* (2013.01); *G02B 7/023* (2013.01); *G02B 7/1805* (2013.01); *G03B 13/34* (2013.01); *H01F 7/081* (2013.01); *H01F 27/28* (2013.01); *H02K 41/02* (2013.01); *H04N 23/55* (2023.01); *H04N 23/57* (2023.01); *H10N 30/202* (2023.02); *H10N 30/88* (2023.02); *G02B 7/04* (2013.01); *H01F 2007/086* (2013.01)

(58) Field of Classification Search
CPC ........ H04N 23/54; H04N 23/57; H04N 23/55; H10N 30/202; H10N 30/88; G01D 5/2046; G02B 7/022; G02B 7/023; G02B 7/1805; G02B 7/04; G03B 13/34; H01F 7/081; H01F 27/28; H01F 2007/086; H01K 41/02
See application file for complete search history.

(56) References Cited

U.S. PATENT DOCUMENTS

| | | | | |
|---|---|---|---|---|
| 2015/0370086 | A1* | 12/2015 | Hamada | H04N 23/54 |
| | | | | 359/557 |
| 2022/0272238 | A1* | 8/2022 | Jang | G02B 7/1805 |

FOREIGN PATENT DOCUMENTS

| | | | | | |
|---|---|---|---|---|---|
| JP | 2022096017 | A | * | 6/2022 | G03B 5/00 |
| WO | WO2021015545 | A1 | | 1/2021 | |

* cited by examiner

*Primary Examiner* — Nathanael R Briggs
(74) *Attorney, Agent, or Firm* — MUNCY, GEISSLER, OLDS & LOWE, P.C.

(57) ABSTRACT

An optical element driving mechanism is provided, including a body, a first driving assembly, a second driving assembly, and an optical element. The body includes a fixed portion, a movable portion, and a connecting element. The movable portion is movable relative to the fixed portion. The connecting element connects the fixed portion to the movable portion. The first driving assembly that is disposed on a first side drives the movable portion to perform a first motion. The second driving assembly that is disposed on the first side drives the movable portion to perform a second motion. The optical element is connected to the movable portion, including an incident surface and an emissive surface, wherein the incident surface is orthogonal to the emissive surface. The first side is not parallel to the incident surface or the emissive surface.

20 Claims, 7 Drawing Sheets

(51)  Int. Cl.

| | | |
|---|---|---|
| *G03B 13/34* | (2021.01) | |
| *H01F 7/08* | (2006.01) | |
| *H01F 27/28* | (2006.01) | |
| *H02K 41/02* | (2006.01) | |
| *H04N 23/55* | (2023.01) | |
| *H04N 23/57* | (2023.01) | |
| *H10N 30/20* | (2023.01) | |
| *H10N 30/88* | (2023.01) | |

OPTICAL ELEMENT DRIVING MECHANISM

CROSS REFERENCE TO RELATED APPLICATIONS

This application claims the benefit of U.S. Provisional Application No. 63/209,750, filed Jun. 11, 2021, the entirety of which is incorporated by reference herein.

BACKGROUND OF THE INVENTION

Field of the Invention

The present disclosure relates to an optical element driving mechanism, and more particularly to an optical element driving mechanism that includes a fulcrum element and a plurality of driving assemblies.

Description of the Related Art

As technology has developed, it has become more common to include image-capturing and video-recording functions into many types of modern electronic devices, such as notebook computers, smartphones, and digital cameras. These electronic devices are used more and more often. In addition to the models that have been developed to be more convenient, thin, and lightweight, it is also desirable to provide optical qualities that are better and more stable, offering consumers more choice.

Electronic devices that have image-capturing or video-recording functions normally include one or more lenses, thereby performing such functions as auto focus (AF), zooming, and optical image stabilization (OIS). Therefore, optical element driving mechanisms often include multiple driving assemblies for driving the optical elements to move. However, traditionally, at least one of the driving assemblies is often disposed in the direction that the light enters and/or leaves the optical element driving mechanism, leaving too much distance between the mass of center of the overall mechanism and the rotational center (e.g. the fulcrum), causing problems like tilting or deflection. As a result, the present disclosure provides an optical element driving mechanism that is different from the prior art, to precisely adjust the positions of the optical elements while preventing the optical element driving mechanism from tilting or deflection.

BRIEF SUMMARY OF THE INVENTION

In one embodiment of the present disclosure, an optical element driving mechanism is provided, including a body, a first driving assembly, a second driving assembly, and an optical element. The body includes a fixed portion, a movable portion, and a connecting element. The movable portion is movable relative to the fixed portion. The connecting element connects the fixed portion to the movable portion. The first driving assembly that is disposed on a first side drives the movable portion to perform a first motion. The second driving assembly that is disposed on the first side drives the movable portion to perform a second motion. The optical element is connected to the movable portion, including an incident surface and an emissive surface, wherein the incident surface is orthogonal to the emissive surface. The first side is not parallel to the incident surface or the emissive surface.

In some embodiments, the body further includes a second side, a third side, a fourth side, a fifth side, and a sixth side. The second side is parallel to the first side. The third side is parallel to the incident surface. The fourth side is parallel to the incident surface, wherein the third side is closer to the incident surface than the fourth side. The fifth side is parallel to the emissive surface. The sixth side is parallel to the emissive surface, wherein the fifth side is closer to the emissive surface than the sixth side. The connecting element is located on the sixth side. No driving assembly is disposed on the third side, the fourth side, the fifth side, or the sixth side.

In some embodiments, the optical element driving mechanism further includes a fulcrum element that is disposed on the sixth side, serving as a fulcrum for the rotational movement of the movable portion relative to the fixed portion.

In some embodiments, the first driving assembly include a first coil and a first magnetic element. The first coil is disposed at the fixed portion. The first magnetic element corresponds to the first coil, and is disposed at the movable portion. The first coil and the first magnetic element at least partially overlap when viewed in a first direction that is perpendicular to the emissive surface and the incident surface.

In some embodiments, the second driving assembly includes a second coil and a second magnetic element. The second coil is disposed at the fixed portion. The second magnetic element corresponds to the second coil, and is disposed at the movable portion. The second coil and the second magnetic element at least partially overlap when viewed in the first direction.

In some embodiments, the first magnetic element includes an N-pole and an S-pole, arranged in a first pole direction, wherein the first pole direction is parallel to a second direction that is perpendicular to the incident surface. The second magnetic element includes an N-pole and an S-pole, arranged in a second pole direction, wherein the second pole direction is parallel to a third direction that is perpendicular to the emissive surface.

In some embodiments, the first motion of the movable portion is a rotational movement around a first axis that is parallel to the first direction. The second motion of the movable portion is a rotational movement around a second axis that is parallel to the second direction.

In some embodiments, the optical element driving mechanism further includes a third driving assembly instead of the second driving assembly, wherein the third driving assembly drives the movable portion to perform the second motion relative to the fixed portion, disposed on the second side.

In some embodiments, the third driving assembly includes a third coil and a third magnetic element. The third coil is disposed at the fixed portion. The third magnetic element corresponds to the third coil, and is disposed at the movable portion. The third coil and the third magnetic element at least partially overlap, and the third driving assembly and the first driving assembly do not overlap when viewed in the first direction.

In some embodiments, the optical element driving mechanism further includes a third driving assembly and a fourth driving assembly. The third driving assembly drives the movable portion to perform the second motion relative to the fixed portion, and is disposed on the second side. The fourth driving assembly drives the movable portion to perform the first motion relative to the fixed portion, and is disposed on the second side.

In some embodiments, the third driving assembly includes a third coil and a third magnetic element. The third coil is disposed at the fixed portion. The third magnetic element corresponds to the third coil, and is disposed at the movable portion. The third coil and the third magnetic element at least partially overlap, and the third driving assembly and the second driving assembly at least partially overlap when viewed in the first direction.

In some embodiments, the fourth driving assembly includes a fourth coil and a fourth magnetic element. The fourth coil is disposed at the fixed portion. The fourth magnetic element corresponds to the fourth coil, and is disposed at the movable portion. The fourth coil and the fourth magnetic element at least partially overlap, and the fourth driving assembly and the first driving assembly at least partially overlap when viewed in the first direction.

In some embodiments, each of the first magnetic element, the second magnetic element, the third magnetic element, and the fourth magnetic element includes an N-pole and an S-pole. The N-poles and the S-poles are, in pairs, respectively arranged in a first pole direction, a second pole direction, a third pole direction, and a fourth pole direction. The first pole direction is parallel to the fourth pole direction, and the second pole direction is parallel to the third pole direction.

In some embodiments, the first pole direction and the fourth pole direction are parallel to a second direction that is perpendicular to the incident surface, and the second pole direction and the third pole direction are parallel to a third direction that is perpendicular to the emissive surface.

In some embodiments, the optical element driving mechanism further includes an optical axis that is perpendicular to the incident surface. The first driving assembly and the fourth driving assembly are disposed symmetrically about the optical axis, and the second driving assembly and the third driving assembly are also disposed symmetrically about the optical axis.

In some embodiments, the optical element driving mechanism further includes a first sensing element, a second sensing element, and a third sensing element. The first sensing element corresponds to the first magnetic element, is disposed at the fixed portion, and is located on the first side. The second sensing element corresponds to the second magnetic element or the third magnetic element, is disposed at the fixed portion, and is located on the first side or the second side. The third sensing element corresponds to the fourth magnetic element, is disposed at the fixed portion, and is located on the second side.

In some embodiments, the optical element driving mechanism further includes an optical axis that is perpendicular to the incident surface. The first sensing element and the third sensing element are disposed symmetrically about the optical axis.

In some embodiments, the second sensing element at least partially overlaps the first sensing element or the third sensing element when viewed in a direction that is perpendicular to the optical axis.

In some embodiments, the first magnetic element and the second magnetic element do not overlap, and the third magnetic element and the fourth magnetic element do not overlap when viewed in the first direction.

In some embodiments, the first magnetic element, the second magnetic element, the third magnetic element, and the fourth magnetic element do not overlap each other when viewed in a second direction that is perpendicular to the first direction.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
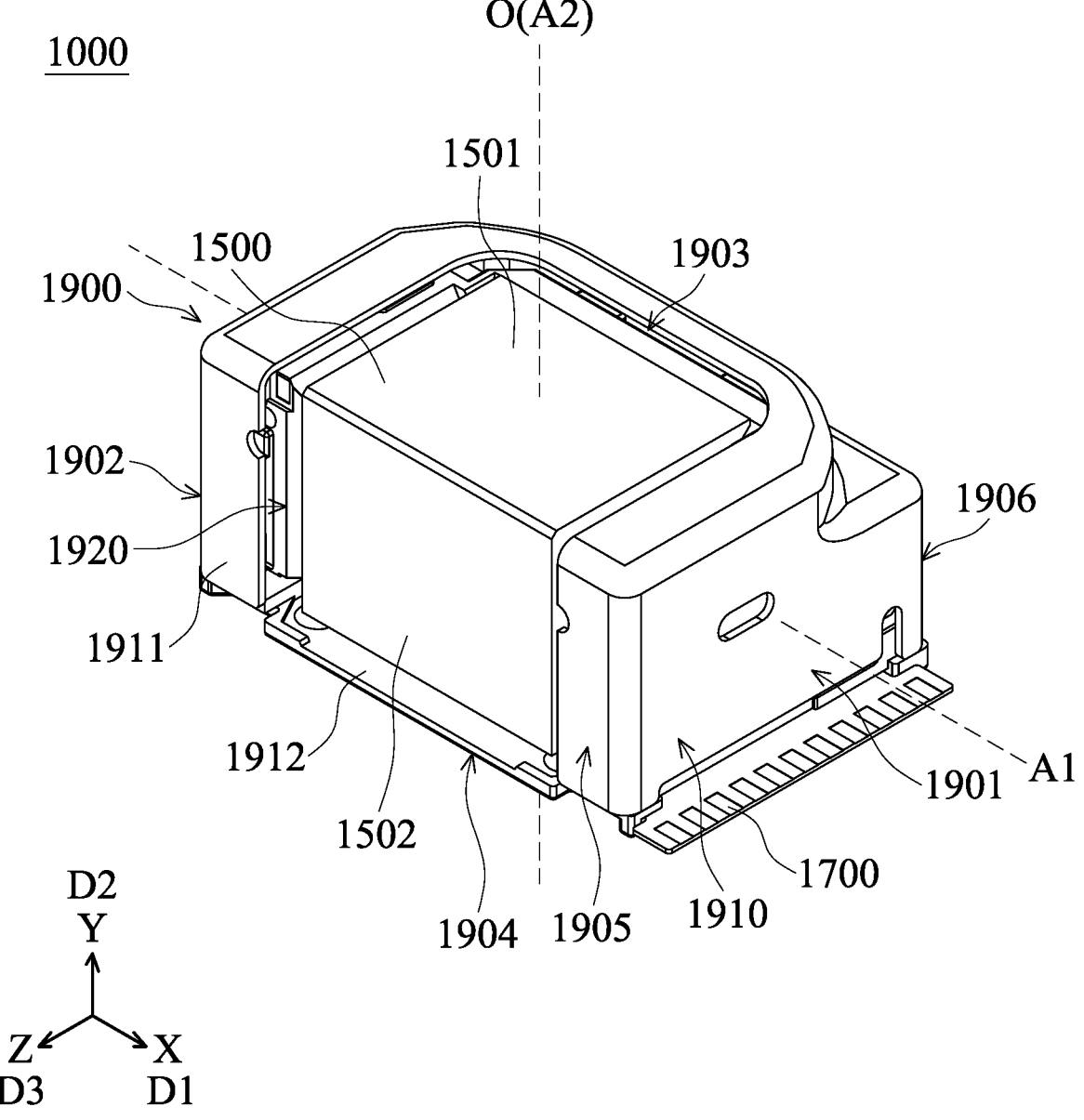
FIG. 1 is a perspective view of the optical element driving mechanism, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various embodiments. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used for ease of the present disclosure of one features relationship to another feature. The spatially relative terms are intended to cover different orientations of the device including the features.

An optical element driving mechanism is provided in the present disclosure, including a plurality of driving assemblies, a movable portion that performs rotational motion, and a fulcrum element served as the fulcrum for the rotational motion. In the configuration provided in the present disclosure, the position of the center of mass of the driving assemblies and the movable portion is close to the position of the fulcrum element. As such, the movable portion would not be affected by gravity or the connecting element (e.g. a spring) which causes tilting or deflection when the driving mechanism is not powered. The optical element driving mechanism according to the present disclosure will be described in detail in the following paragraphs with reference to the accompanying figures.

Referring to FIG. 1, FIG. 1 is a perspective view of the optical element driving mechanism 1000, according to some embodiments of the present disclosure. As shown in FIG. 1, the optical element driving mechanism 1000 mainly includes an optical element 1500 and a body 1900. The optical element 1500 may be a prism, for example, for changing the traveling direction of the light. For example, the optical element 1500 may have an incident surface 1501, an emissive surface 1502, and an inclined surface for reflection. In the embodiments shown in FIG. 1, the incident surface 1501 is the surface where the light pass when it enters the optical element driving mechanism 1000. The incident surface 1501 is perpendicular to the optical axis O. The emissive surface 1502 is the surface where the light pass when it leaves the optical element driving mechanism 1000. The emissive surface 1502 is orthogonal to the incident surface 1501. The inclined surface for reflection is parallel to the reflecting surface 1925 of the body 1900 (see FIG. 3A and FIG. 3B). Using the optical characteristics of the optical element 1500, the light changes its traveling direction after it arrives at the inclined surface for reflection, thereby obtaining the desired optical effects. In some embodiments, the light enters the optical element driving mechanism 1000 through the incident surface 1501 along the optical axis O, changes its traveling direction via the inclined surface (e.g. from the second direction D2 to the third direction D3), and leaves the optical element driving mechanism 1000 through the emissive surface 1502.

Figure 2:
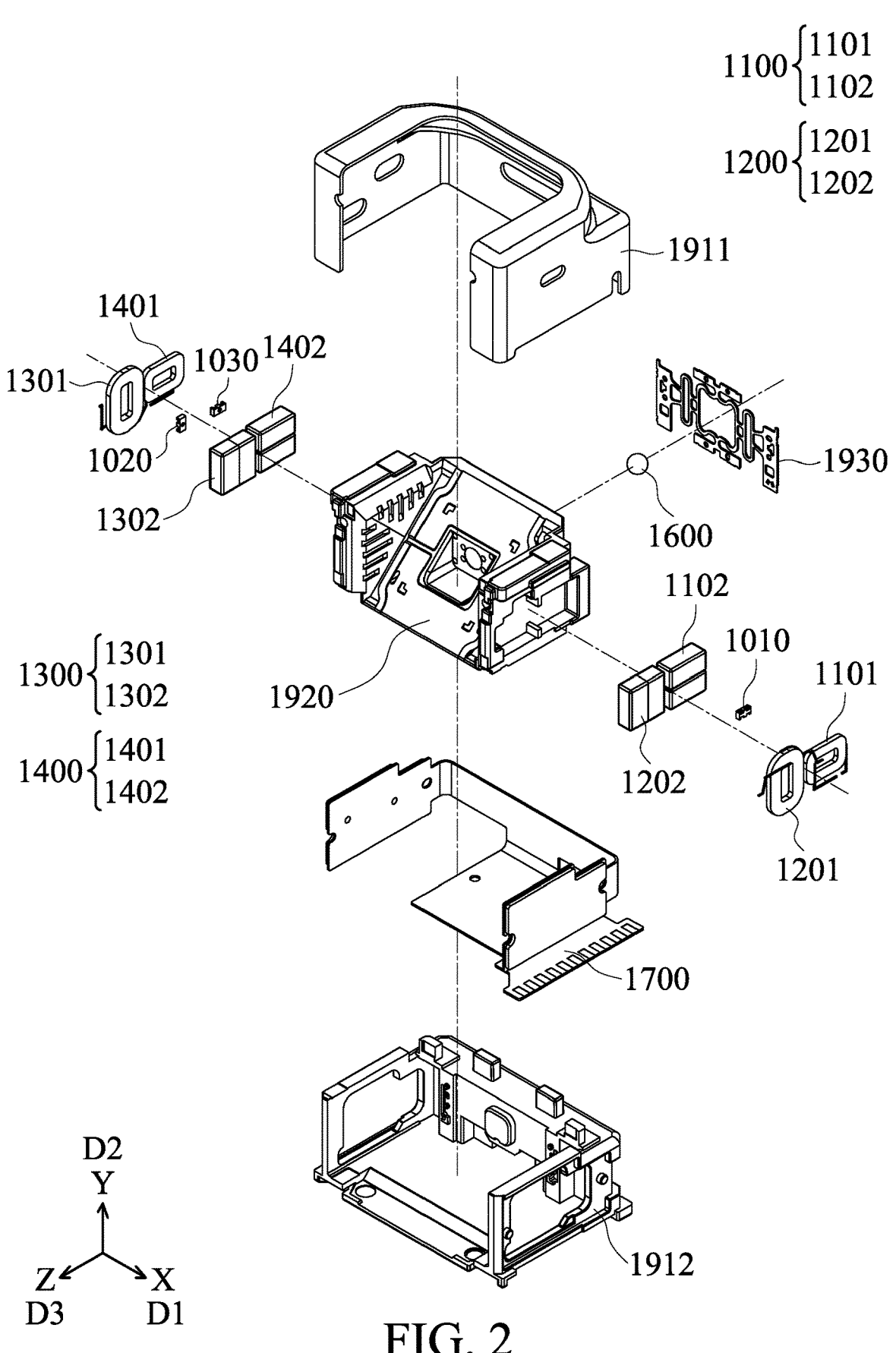
FIG. 2 is an exploded view of the optical element driving mechanism, according to some embodiments of the present disclosure, wherein the optical element is omitted.

The body 1900 may include a fixed portion 1910, a movable portion 1920, and a connecting element 1930 (see FIG. 2). The optical element 1500 is connected to the movable portion 1920, thereby moving along with the movable portion 1920 relative to the fixed portion 1910, obtaining the desired optical effects. The connecting element 1930 connects the fixed portion 1910 to the movable portion 1920. In some embodiments, the connecting element 1930 may be a resilient element or a spring, etc., providing the movable portion 1920 with restoring force for moving relative to the fixed portion 1910. As shown in FIG. 1, the body 1900 is substantially a cuboid, having six side surfaces, which are the first side 1901, the second side 1902, the third side 1903, the fourth side 1904, the fifth side 1905, and the sixth side 1906. In the embodiment shown in FIG. 1, the first side 1901 is not parallel to the incident surface 1501 or the emissive surface 1502. The second side 1902 is parallel to the first side 1901. The first side 190.1 and the second side 1902 are both perpendicular to the first direction D1. The third side 1903 and the fourth side 1904 are both parallel to the incident surface 1501, wherein the third side 1903 is closer to the incident surface 1501 than the fourth side 1904. The third side 1903 and the fourth side 1904 are both perpendicular to the second direction D2. The fifth side 1905 and the sixth side 1906 are both parallel to the emissive surface 1502, wherein the fifth side 1905 is closer to the emissive surface 1502 than the sixth side 1906. The fifth side 1905 and the sixth side 1906 are both perpendicular to the third direction D3. In some embodiments, the connecting element 1930 is located on the sixth side 1906 (see FIG. 5).

Next, referring to FIG. 2, FIG. 2 is an exploded view of the optical element driving mechanism 1000, according to some embodiments of the present disclosure, wherein the optical element 1500 is omitted. As shown in FIG. 2, the fixed portion 1910 may include a frame 1911 and a bottom 1912. In some embodiments, the optical element driving mechanism 1000 further includes a first driving assembly 1100, a second driving assembly 1200, a third driving assembly 1300, a fourth driving assembly 1400, a fulcrum element 1600, and a circuit assembly 1700. The first driving assembly 1100, the second driving assembly 1200, the third driving assembly 1300, the fourth driving assembly 1400, the fulcrum element 1600, and the movable portion 1920 may be disposed between the frame 1911 and the bottom 1912.

The first driving assembly 1100 may drive the movable portion 1920 to perform a first motion relative to the fixed portion 1910, and may be disposed on the first side 1901 of the body 1900. The second driving assembly 1200 may drive the movable portion 1920 to perform a second motion relative to the fixed portion 1910, and may also be disposed on the first side 1901 of the body 1900. The third driving assembly 1300 may drive the movable portion 1920 to perform the second motion relative to the fixed portion 1910, and may be disposed on the second side 1902. The fourth driving assembly 1400 may drive the movable portion 1920 to perform the first motion relative to the fixed portion 1910, and may be disposed on the second side 1902.

In some embodiments, the first motion of the movable portion 1920 is a rotational movement of the movable portion 1920 around a first axis A1 that is parallel to the first direction D1, and the second motion of the movable portion 1920 is a rotational movement of the movable portion 1920 around a second axis A2 that is parallel to the second direction D2. The fulcrum element 1600 is disposed on the sixth side 1906 of the body 1900, serving as a fulcrum for the rotational movement of the movable portion 1920 relative to the fixed portion 1910. Using the movable portion 1920 to move the optical element 1500 in two different directions, desired optical effects may be achieved further.

The circuit assembly 1700 may be connected to the first driving assembly 1100, the second driving assembly 1200, the third driving assembly 1300, and the fourth driving assembly 1400. An external control assembly (not shown) may input driving signals to each driving assembly for control purposes.

Figure 3A:
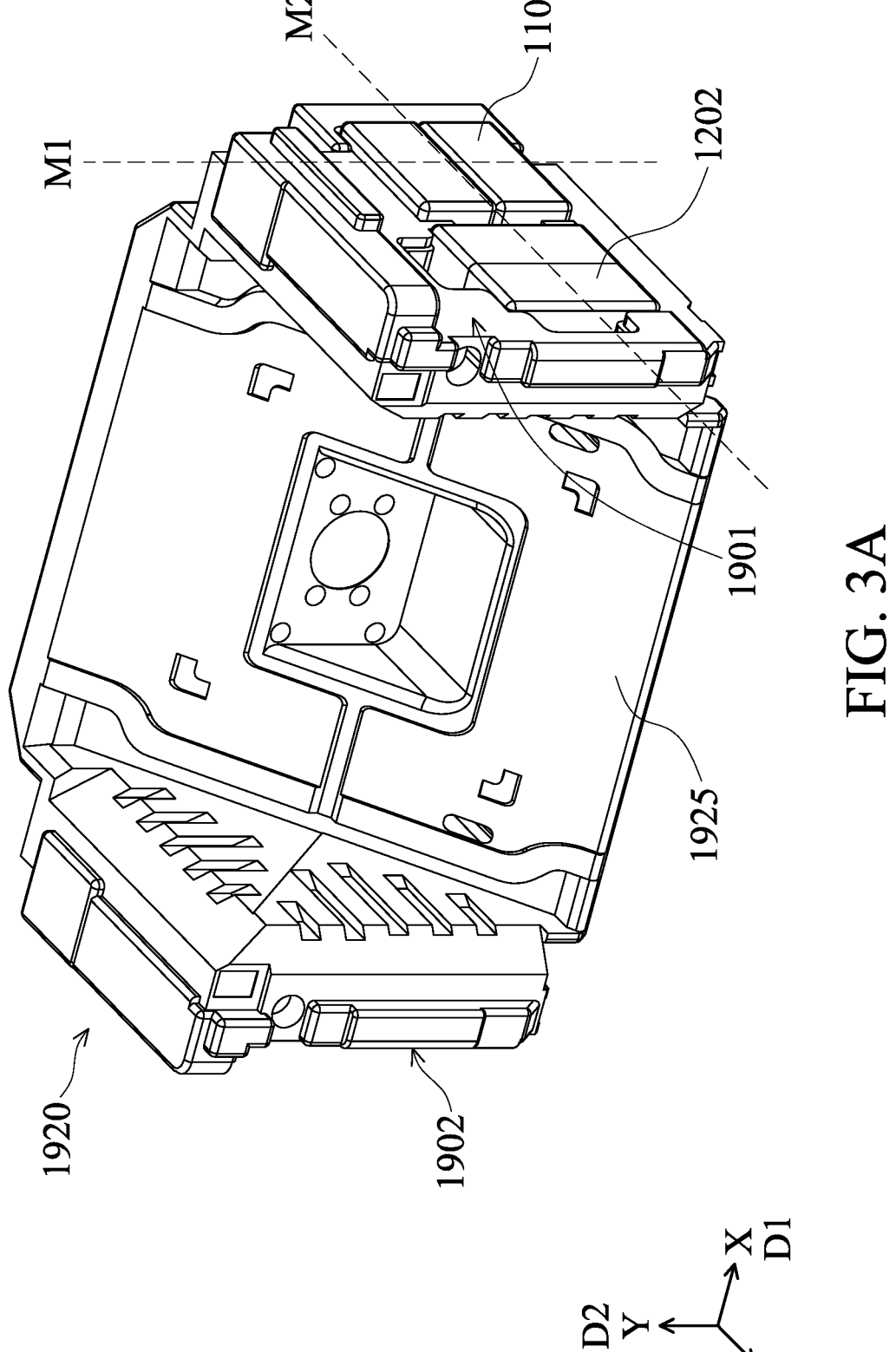
FIG. 3A is a right side perspective view of the movable portion, according to some embodiments of the present disclosure.
Figure 3B:
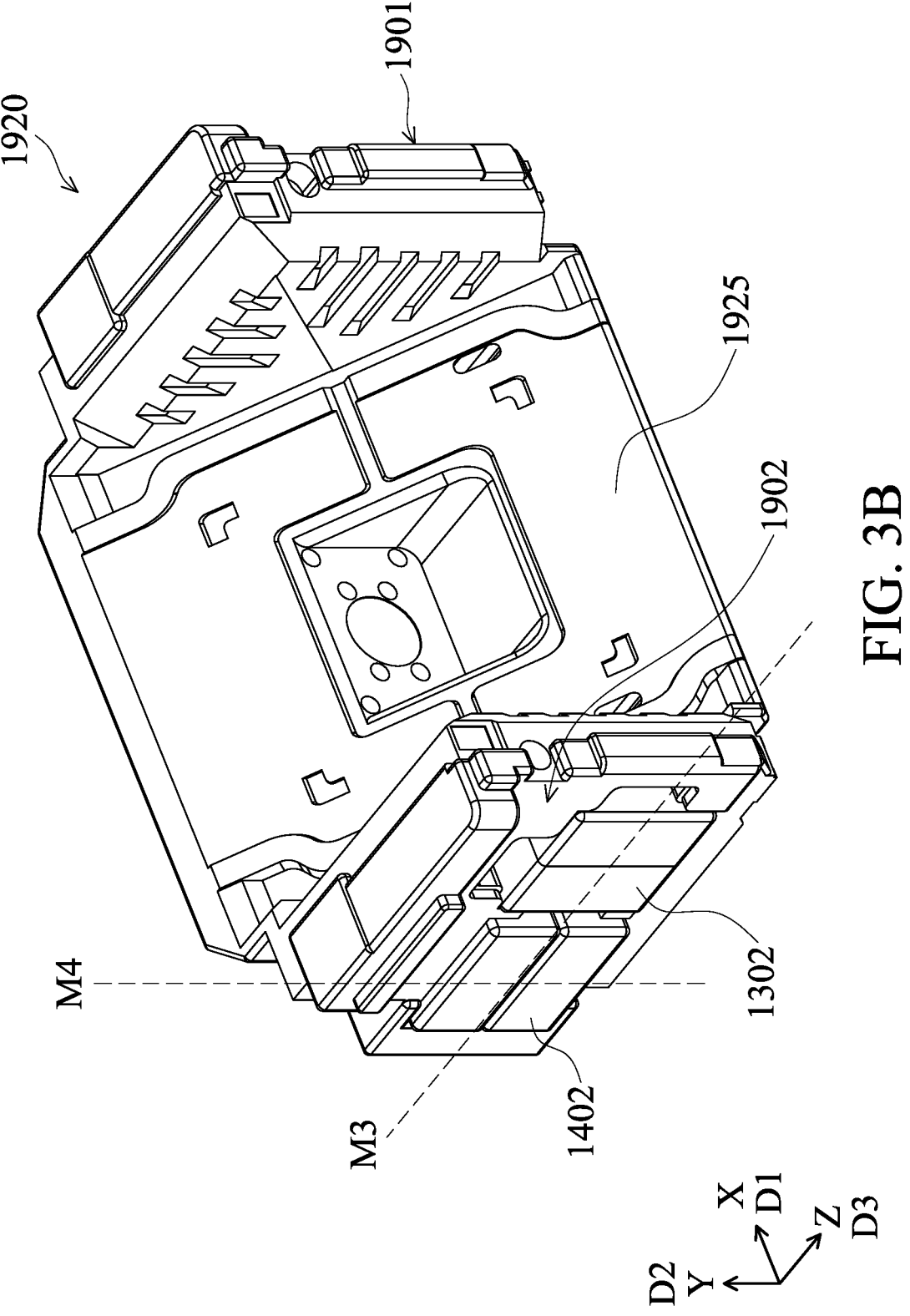
FIG. 3B is a left side perspective view of the movable portion, according to some embodiments of the present disclosure.
Figure 4A:
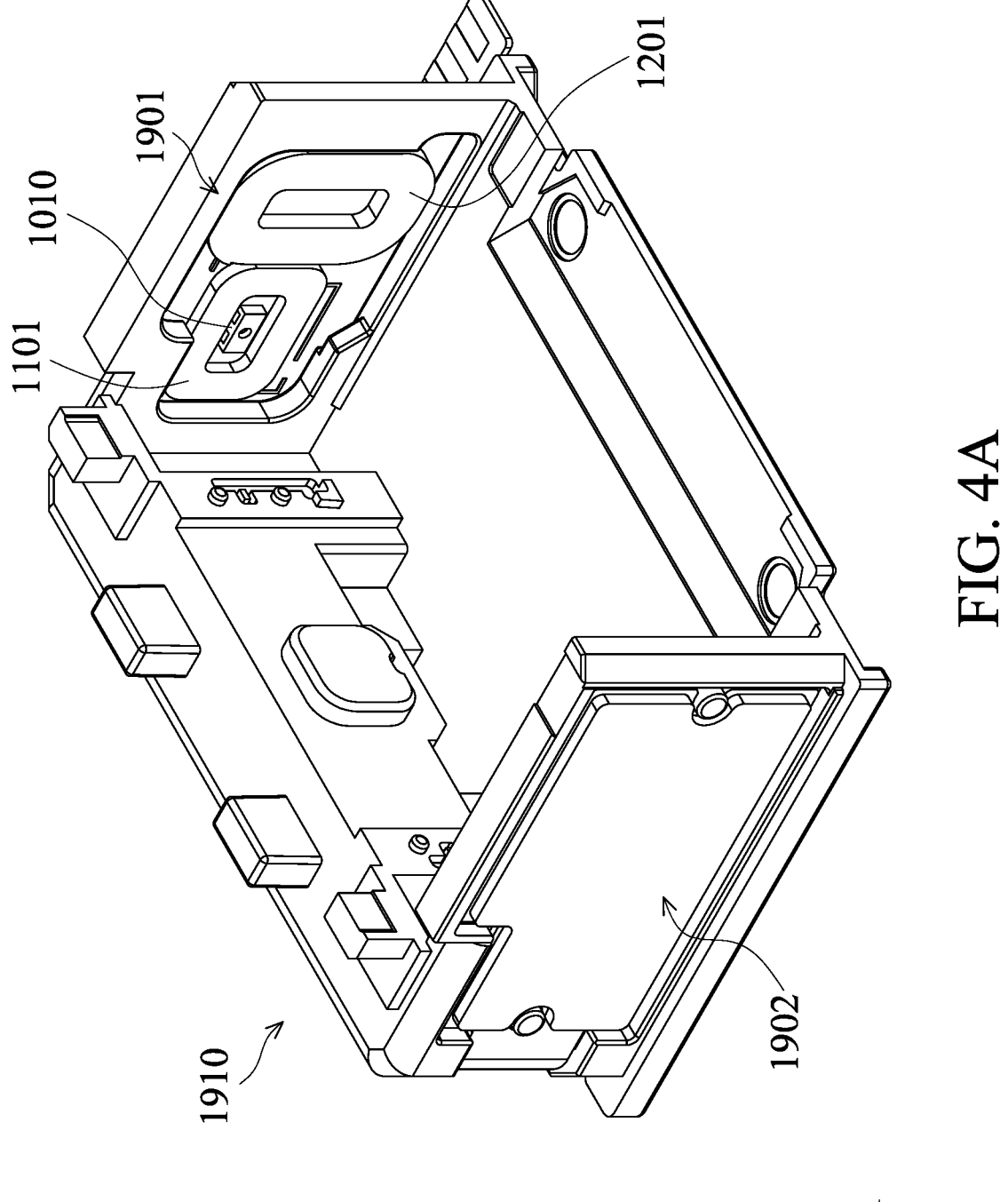
FIG. 4A is a left side perspective view of the fixed portion, according to some embodiments of the present disclosure.
Figure 4B:
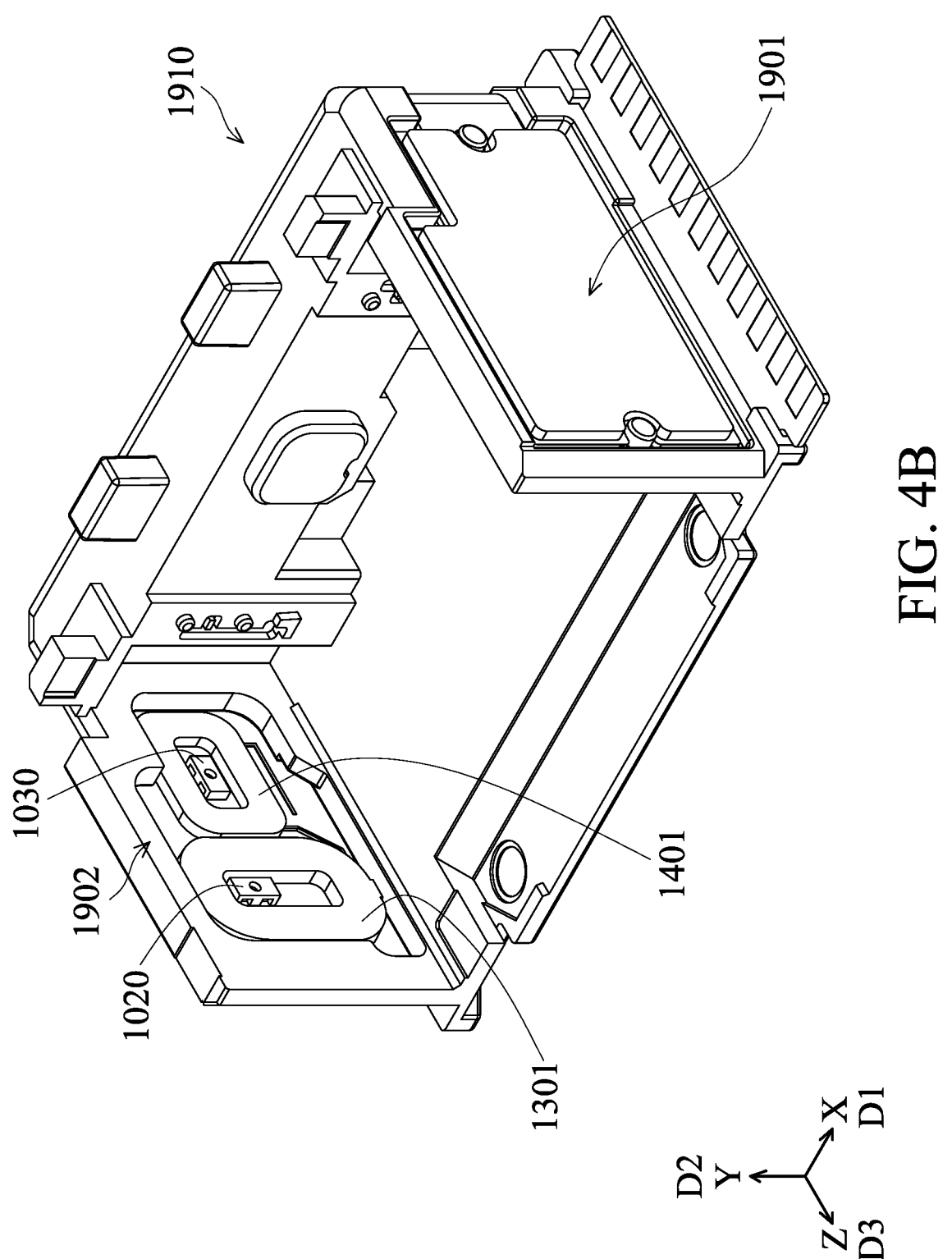
FIG. 4B is a right side perspective view of the fixed portion, according to some embodiments of the present disclosure.

Next, referring to FIG. 2, FIG. 3A, FIG. 3B, FIG. 4A, and FIG. 4B, FIGS. 3A and 3B are a right side perspective view and a left side perspective view of the movable portion 1920, respectively, according to some embodiments of the present disclosure. FIGS. 4A and 4B are a left side perspective view and a right side perspective view of the fixed portion 1910, respectively, according to some embodiments of the present disclosure. In some embodiments, the first driving assembly 1100 includes a first coil 1101 and a first magnetic element 1102. The first coil 1101 is disposed at the fixed portion 1910. The first magnetic element 1102 that corresponds to the first coil 1101 is disposed at the movable portion 1920. The first coil 1101 and the first magnetic element 1102 at least partially overlap when viewed in the first direction D1. The movable portion 1920 is driven to perform the first motion by the electromagnetic force generated between the first coil 1101 and the first magnetic element 1102. Similarly, the second driving assembly 1200 includes a second coil 1201 and a second magnetic element 1202. The second coil 1201 is disposed at the fixed portion 1910. The second magnetic element 1202 that corresponds to the second coil 1201 is disposed at the movable portion 1920. The second coil 1201 and the second magnetic element 1202 at least partially overlap when viewed in the first direction D1. The movable portion 1920 is driven to perform the second motion by the electromagnetic force generated between the second coil 1201 and the second magnetic element 1202.

In some embodiments, the third driving assembly 1300 corresponds to the second driving assembly 1200, and the fourth driving assembly 1400 corresponds to the first driving assembly 1100. The third driving assembly 1300 includes a third coil 1301 and a third magnetic element 1302. The third coil 1301 is disposed at the fixed portion 1910. The third magnetic element 1302 that corresponds to the third coil 1301 is disposed at the movable portion 1920. The third coil 1301 and the third magnetic element 1302 at least partially overlap when viewed in the first direction D1. The movable portion 1920 is driven to perform the second motion by the electromagnetic force generated between the third coil 1301 and the third magnetic element 1302. The fourth driving assembly 1400 includes a fourth coil 1401 and a fourth magnetic element 1402. The fourth coil 1401 is disposed at the fixed portion 1910. The fourth magnetic element 1402 that corresponds to the fourth coil 1401 is disposed at the movable portion 1920. The fourth coil 1401 and the fourth magnetic element 1402 at least partially overlap when viewed in the first direction D1. The movable portion 1920 is driven to perform the first motion by the electromagnetic force generated between the fourth coil 1401 and the fourth magnetic element 1402.

In order to make the center of mass of the entire first driving assembly 1100, second driving assembly 1200, third driving assembly 1300, fourth driving assembly 1400, and the movable portion 1920 to be closer to the position of the fulcrum element 1600, the first driving assembly 1100 and the fourth driving assembly 1400 are disposed symmetrically about the optical axis O, and the second driving assembly 1200 and the third driving assembly 1300 are disposed symmetrically about the optical axis O. Therefore, the first driving assembly 1100 and the fourth driving assembly 1400 at least partially overlap, and the second driving assembly 1200 and the third driving assembly 1300 at least partially overlap when viewed in the first direction D1. Additionally, the first driving assembly 1100 and the third driving assembly 1300 do not overlap when viewed in the first direction D1.

As shown in FIG. 3A and FIG. 3B, each of the first magnetic element 1102, the second magnetic element 1202, the third magnetic element 1302, and the fourth magnetic element 1402 includes an N-pole and an S-pole. The N-poles and the S-poles are, in pairs, respectively arranged in a first pole direction M1, a second pole direction M2, a third pole direction M3, and a fourth pole direction M4. It should be noted that the positions of the N-poles and the S-poles are not limited to the embodiments shown in FIG. 3A and FIG. 3B. They may be exchanged depending on actual needs. In some embodiments, the first pole direction M1 is parallel to the fourth pole direction M4, and the second pole direction M2 is parallel to the third pole direction M3. In some specific embodiments, the first pole direction M1 and the fourth pole direction M4 are parallel to the second direction D2, and the second pole direction M2 and the third pole direction M3 are parallel to the third direction D3. In some embodiments, the first magnetic element 1102 and the second magnetic element 1202 do not overlap, and the third magnetic element 1302 and the fourth magnetic element 1402 do not overlap when viewed in the first direction D1. The first magnetic element 1102, the second magnetic element 1202, the third magnetic element 1302, and the fourth magnetic element 1402 do not overlap each other when viewed in the second direction D2.

In some embodiments, since each of the first magnetic element 1102, the second magnetic element 1202, the third magnetic element 1302, and the fourth magnetic element 1402 corresponds to the first coil 1101, the second coil 1201, the third coil 1301, and the fourth coil 1401, respectively, the first coil 1101 and the second coil 1201 do not overlap, and the third coil 1301 and the fourth coil 1401 do not overlap when viewed in the first direction D1. In addition, the first coil 1101, the second coil 1201, the third coil 1301, and the fourth coil 1401 do not overlap each other when viewed in the second direction D2.

Referring to FIG. 2, FIG. 4A and FIG. 4B, in some embodiments, the optical element driving mechanism 1000 further includes a first sensing element 1010, a second sensing element 1020, and a third sensing element 1030. The first sensing element 1010 corresponds to the first magnetic element 1102, is disposed at the fixed portion 1910, and is located on the first side 1901. In some embodiments, the first sensing element 1010 is disposed at the center portion of the first coil 1101. The first sensing element 1010 may be used to sense the displacement and/or rotation of the first motion of the movable portion 1920. The second sensing element 1020 corresponds to the second magnetic element 1202 or the third magnetic element 1302, and is disposed at the fixed portion 1910. Depending on users' requirements, the second sensing element 1020 may be disposed at the center portion of the second coil 1201, and is located on the first side 1901, or, the second sensing element 1020 may be disposed at the center portion of the third coil 1301, and is located on the second side 1902. In the embodiments shown in FIG. 4A and FIG. 4B, the second sensing element 1020 corresponds to the third magnetic element 1302, is located on the second side 1902, and is disposed at the center portion of the third coil 1301. The second sensing element 1020 may be used to sense the displacement and/or rotation of the second motion of the movable portion 1920. The third sensing element 1030 corresponds to the fourth magnetic element 1402, is disposed at the fixed portion 1910, and is located on the second side 1902. In some embodiments, the third sensing element 1030 is disposed at the center portion of the fourth coil 1401. The third sensing element 1030 may be used to sense the displacement and/or rotation of the first motion of the movable portion 1920. As such, using both the first sensing element 1010 and the third sensing element 1030 at the same time to measure the displacement and/or rotation of the first motion of the movable portion 1920 may achieve more accurate sensing. The displacement and/or rotation of the movable portion 1920 may be determined more precisely, thereby obtaining better optical quality.

In some embodiments, in order to make the center of mass to be closer to the fulcrum element 1600 that is located in the center area, the first sensing element 1010 and the third sensing element 1030 are disposed symmetrically about the optical axis O. Therefore, the first sensing element 1010 and the third sensing element 1030 at least partially overlap when viewed in the first direction D1. In addition, the second sensing element 1020 and the third sensing element 1030 at least partially overlap when viewed in the third direction D3. In the embodiments where the second sensing element 1020 corresponds to the second magnetic element 1202, the second sensing element 1020 and the first sensing element 1010 at least partially overlap when viewed in the third direction D3.

Figure 5:
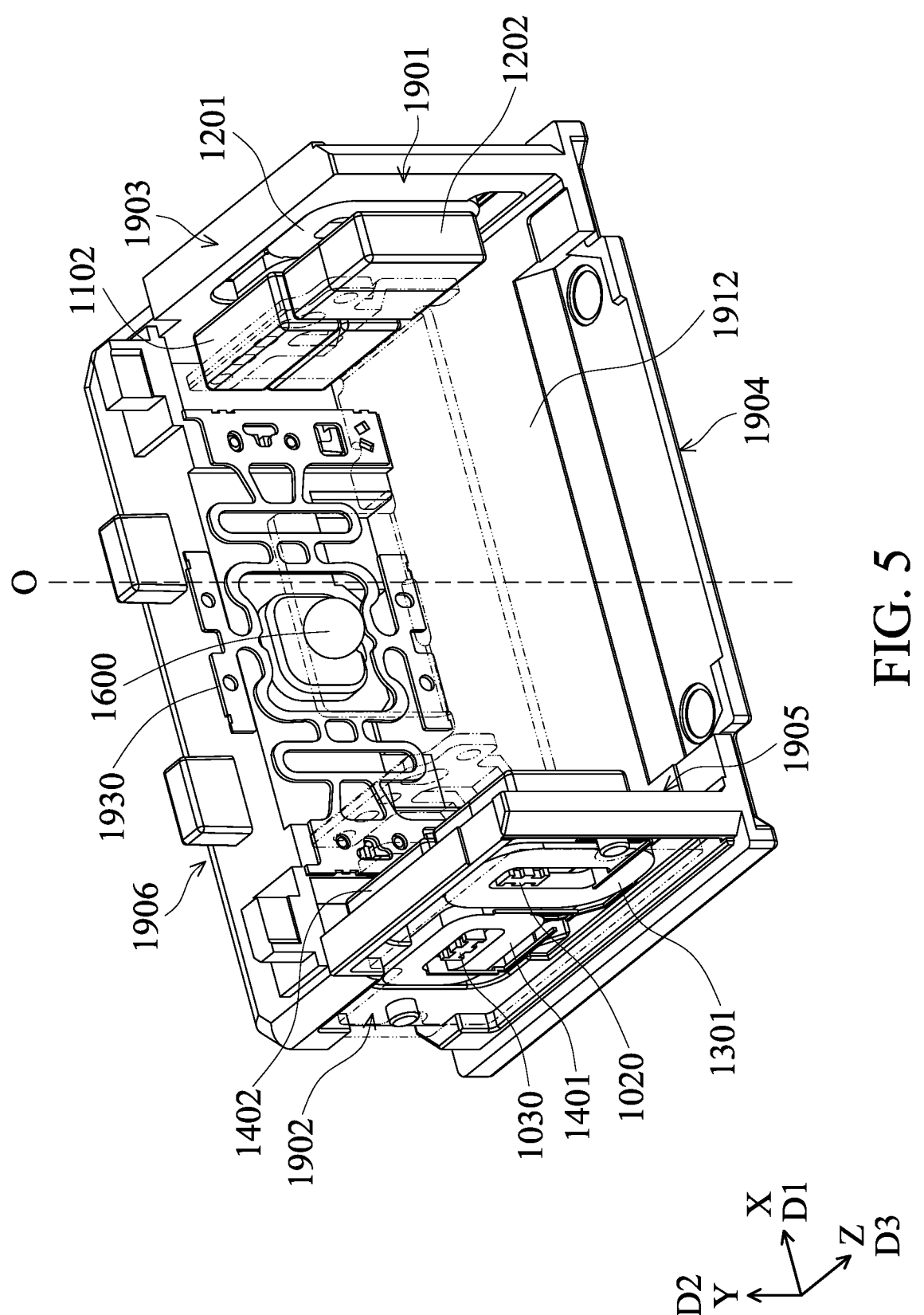
FIG. 5 is a partial perspective view of the optical element driving mechanism, according to some embodiments of the present disclosure.

Next, referring to FIG. 5, FIG. 5 is a partial perspective view of the optical element driving mechanism 1000, according to some embodiments of the present disclosure. The relative positions between each of the driving assemblies and the fulcrum element 1600 are shown clearly in FIG. 5. As mentioned above, the components that respectively locate on the first side 1901 and the second side 1902 may be disposed symmetrically about the optical axis O, so that the overall center of mass may fall in the vicinity of the center of the entire optical element driving mechanism 1000, which is close to the fulcrum element 1600, thereby preventing tilting or deflection when not powered.

In some other embodiments, under the premise that the overall center of mass is close to the fulcrum element 1600, the optical element driving mechanism 1000 may only include the first driving assembly 1100 and the third driving assembly 1300. That is, two driving assemblies for different motion are located on opposite sides of the body 1900, respectively. This is advantageous for precisely controlling the motion of the movable portion 1920 without interference such as tilting or deflection. In yet some other embodiments, the optical element driving mechanism 1000 may only include the first driving assembly 1100 and the second driving assembly 1200 as well. That is, two driving assemblies for different motion are located on the same side of the body 1900. This is beneficial for overall miniaturization. Also, since the first pole direction M1 and the second pole direction M2 of the first magnetic element 1102 and the second magnetic element 1202 that are included in the first driving assembly 1100 and second driving assembly 1200 are different, magnetic interference therebetween may be avoided. It should be noted that, according to the embodiments presented in the present disclosure, the first driving assembly 1100, the second driving assembly 1200, the third driving assembly 1300, and the fourth driving assembly 1400 are not located on the third side 1903, the fourth side 1904, the fifth side 1905, or the sixth side 1906 of the body 1900.

In summary, the optical element driving mechanism 1000 provided in the present disclosure includes a plurality of driving assemblies (e.g. the first driving assembly 1100, the second driving assembly 1200, the third driving assembly 1300, and the fourth driving assembly 1400). In various embodiments provided in the present disclosure, all of the driving assemblies are located on the first side 1901 and/or the second side 1902 of the body 1900. Additionally, in the embodiments where the driving assemblies are disposed symmetrically about the optical axis O, the center of mass of the driving assemblies and the movable portion 1920 is close to the position of the fulcrum element 1600, so that the movable portion 1920 would not be affected by gravity or restoring force provided by the connecting element 1930 when not powered, preventing tilting or deflection. This improves stability and miniaturization of the mechanism. In addition, by using a plurality of sensing elements (e.g. the first sensing element 1010, the second sensing element 1020, and the third sensing element 1030), more precise sensing results may be obtained to improve optical quality.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. An optical element driving mechanism, comprising:
a body;
a fixed portion;
a movable portion, being movable relative to the fixed portion; and
a connecting element, connecting the fixed portion to the movable portion, and providing the movable portion with restoring force for moving relative to the fixed portion;
a first driving assembly, driving the movable portion to perform a first motion relative to the fixed portion, disposed on a first side of the body;
a second driving assembly, driving the movable portion to perform a second motion relative to the fixed portion, disposed on the first side;
an optical element, connected to the movable portion, including an incident surface and an emissive surface, wherein the incident surface is orthogonal to the emissive surface; and
a fulcrum element, wherein a position of the fulcrum element is close to a center of mass of the first driving assembly, the second driving assembly, and the movable portion;
wherein the first side is not parallel to the incident surface or the emissive surface;
wherein the connecting element and the fulcrum element do not overlap when viewed along a third direction that is perpendicular to the emissive surface;
wherein the connecting element and the fulcrum element do not overlap when viewed along a second direction that is perpendicular to the incident surface; and
wherein the second direction is perpendicular to the third direction.

2. The optical element driving mechanism as claimed in claim 1, wherein the body further comprises:
a second side parallel to the first side;
a third side parallel to the incident surface;
a fourth side parallel to the incident surface, wherein the third side is closer to the incident surface than the fourth side;
a fifth side parallel to the emissive surface; and
a sixth side parallel to the emissive surface, wherein the fifth side is closer to the emissive surface than the sixth side;
wherein the connecting element is located on the sixth side; and
wherein no driving assembly is disposed on the third side, the fourth side, the fifth side, or the sixth side.

3. The optical element driving mechanism as claimed in claim 2, wherein the fulcrum element is disposed on the sixth side, serving as a fulcrum for the rotational movement of the movable portion relative to the fixed portion.

4. The optical element driving mechanism as claimed in claim 2, wherein the first driving assembly comprises:

a first coil disposed at the fixed portion; and a first magnetic element, corresponding to the first coil, disposed at the movable portion;

wherein the first coil and the first magnetic element at least partially overlap when viewed in a first direction that is perpendicular to the emissive surface and the incident surface.

5. The optical element driving mechanism as claimed in claim 4, wherein the second driving assembly comprises:

a second coil disposed at the fixed portion; and a second magnetic element, corresponding to the second coil, disposed at the movable portion;

wherein the second coil and the second magnetic element at least partially overlap when viewed in the first direction.

6. The optical element driving mechanism as claimed in claim 5, wherein:

the first magnetic element includes an N-pole and an S-pole, arranged in a first pole direction, wherein the first pole direction is parallel to the second direction; and the second magnetic element includes an N-pole and an S-pole, arranged in a second pole direction, wherein the second pole direction is parallel to a third direction that is perpendicular to the emissive surface.

7. The optical element driving mechanism as claimed in claim 6, wherein:

the first motion of the movable portion is a rotational movement around a first axis that is parallel to the first direction; and the second motion of the movable portion is a rotational movement around a second axis that is parallel to the second direction.

8. An optical element driving mechanism, comprising:

a body;

a fixed portion;

a movable portion, being movable relative to the fixed portion;

a connecting element, connecting the fixed portion to the movable portion, and providing the movable portion with restoring force for moving relative to the fixed portion;

a first driving assembly, driving the movable portion to perform a first motion relative to the fixed portion, disposed on a first side of the body;

a third driving assembly, driving the movable portion to perform a second motion relative to the fixed portion, disposed on a second side of the body that is parallel to the first side;

an optical element, connected to the movable portion, including an incident surface and an emissive surface, wherein the incident surface is orthogonal to the emissive surface; and a fulcrum element, wherein a position of the fulcrum element is close to a center of mass of the first driving assembly, the third driving assembly, and the movable portion;

wherein the first side is not parallel to the incident surface or the emissive surface; and wherein the connecting element and the fulcrum element do not overlap when viewed along a third direction that is perpendicular to the emissive surface;

wherein the connecting element and the fulcrum element do not overlap when viewed along a second direction that is perpendicular to the incident surface; and wherein the second direction is perpendicular to the third direction.

9. The optical element driving mechanism as claimed in claim 8, wherein the third driving assembly comprises:

a third coil disposed at the fixed portion; and a third magnetic element, corresponding to the third coil, disposed at the movable portion;

wherein the third coil and the third magnetic element at least partially overlap, and the third driving assembly and the first driving assembly do not overlap when viewed in the first direction.

10. The optical element driving mechanism as claimed in claim 4, further comprising:

a third driving assembly, driving the movable portion to perform the second motion relative to the fixed portion, disposed on the second side; and a fourth driving assembly, driving the movable portion to perform the first motion relative to the fixed portion, disposed on the second side.

11. The optical element driving mechanism as claimed in claim 10, wherein the third driving assembly comprises:

a third coil disposed at the fixed portion; and a third magnetic element, corresponding to the third coil, disposed at the movable portion;

wherein the third coil and the third magnetic element at least partially overlap, and the third driving assembly and the second driving assembly at least partially overlap when viewed in the first direction.

12. The optical element driving mechanism as claimed in claim 11, wherein the fourth driving assembly comprises:

a fourth coil disposed at the fixed portion; and a fourth magnetic element, corresponding to the fourth coil, disposed at the movable portion;

wherein the fourth coil and the fourth magnetic element at least partially overlap, and the fourth driving assembly and the first driving assembly at least partially overlap when viewed in the first direction.

13. The optical element driving mechanism as claimed in claim 12, wherein each of the first magnetic element, the second magnetic element, the third magnetic element, and the fourth magnetic element includes an N-pole and an S-pole, wherein the N-poles and the S-poles are, in pairs, respectively arranged in a first pole direction, a second pole direction, a third pole direction, and a fourth pole direction; and wherein the first pole direction is parallel to the fourth pole direction, and the second pole direction is parallel to the third pole direction.

14. The optical element driving mechanism as claimed in claim 13, wherein the first pole direction and the fourth pole direction are parallel to a second direction that is perpendicular to the incident surface, and the second pole direction and the third pole direction are parallel to the third direction that is perpendicular to the emissive surface.

15. The optical element driving mechanism as claimed in claim 12, further comprising an optical axis that is perpendicular to the incident surface;

wherein the first driving assembly and the fourth driving assembly are disposed symmetrically about the optical axis, and the second driving assembly and the third driving assembly are also disposed symmetrically about the optical axis.

16. The optical element driving mechanism as claimed in claim 12, further comprising:

a first sensing element, corresponding to the first magnetic element, disposed at the fixed portion, located on the first side;

a second sensing element, corresponding to the second magnetic element or the third magnetic element, disposed at the fixed portion, located on the first side or the second side; and a third sensing element, corresponding to the fourth magnetic element, disposed at the fixed portion, located on the second side.

17. The optical element driving mechanism as claimed in claim 16, further comprising an optical axis that is perpendicular to the incident surface;

wherein the first sensing element and the third sensing element are disposed symmetrically about the optical axis.

18. The optical element driving mechanism as claimed in claim 17, wherein the second sensing element at least partially overlaps the first sensing element or the third sensing element when viewed in a direction that is perpendicular to the optical axis.

19. The optical element driving mechanism as claimed in claim 12, wherein the first magnetic element and the second magnetic element do not overlap, and the third magnetic element and the fourth magnetic element do not overlap when viewed in the first direction.

20. The optical element driving mechanism as claimed in claim 19, wherein the first magnetic element, the second magnetic element, the third magnetic element, and the fourth magnetic element do not overlap each other when viewed in a second direction that is perpendicular to the first direction.

\* \* \* \* \*